(12) United States Patent
Wu et al.

(10) Patent No.: US 10,848,178 B1
(45) Date of Patent: Nov. 24, 2020

(54) COMPRESSOR, ADDER CIRCUIT AND OPERATION METHOD THEREOF

(71) Applicant: DigWise Technology Corporation, LTD, Hsinchu County (TW)

(72) Inventors: JingJie Wu, Beijing (CN); Chih-Wen Yang, Hsinchu County (TW); Shih-Che Yen, Hsinchu County (TW); Chien-Pang Lu, Hsinchu County (TW)

(73) Assignee: DigWise Technology Corporation, LTD, Hsinchu County (TW)

( * ) Notice: Subject to any disclaimer, the term of this patent is extended or adjusted under 35 U.S.C. 154(b) by 0 days.

(21) Appl. No.: 16/908,690

(22) Filed: Jun. 22, 2020

(30) Foreign Application Priority Data

Feb. 6, 2020 (TW) ................ 109103609 A

(51) Int. Cl.
*H03M 7/30* (2006.01)
*H03K 19/20* (2006.01)
*G06F 7/503* (2006.01)

(52) U.S. Cl.
CPC .............. *H03M 7/30* (2013.01); *G06F 7/503* (2013.01); *H03K 19/20* (2013.01)

(58) Field of Classification Search
CPC ........... H03M 7/30; H03K 19/20; G06F 7/503
USPC ..................................... 341/50, 87
See application file for complete search history.

(56) References Cited

U.S. PATENT DOCUMENTS

| 5,473,559 A | 12/1995 | Makino |
| 5,528,177 A | 6/1996 | Sridhar et al. |
| 5,640,685 A * | 6/1997 | Komoda ................. H03G 7/008 381/106 |
| 5,920,498 A * | 7/1999 | Goto ........................ G06F 7/509 708/703 |
| 8,032,819 B2 * | 10/2011 | Abe ........................ H03K 19/21 714/823 |

FOREIGN PATENT DOCUMENTS

| CN | 101140511 | 10/2010 |
| TW | I301587 | 10/2008 |
| TW | 201622354 | 6/2016 |

OTHER PUBLICATIONS

Sreehari Veeramachaneni, et al., "Novel Architectures for High-Speed and Low-Power 3-2, 4-2 and 5-2 Compressors", 20th International Conference on VLSI Design held jointly with 6th International Conference on Embedded Systems (VLSID'07), Jan. 6-10, 2007, pp. 1-6.

(Continued)

*Primary Examiner* — Brian K Young
(74) *Attorney, Agent, or Firm* — JCIPRNET

(57) ABSTRACT

A compressor, an adder circuit, and an operation method thereof are provided. The compressor includes a first adder circuit and a second adder circuit. The first adder circuit receives a plurality of input values. The first adder circuit outputs a first inverted sum value (an inverted signal of a sum value) and a first inverted carry value (an inverted signal of a carry value). One of a plurality of input terminals of the second adder circuit is coupled to the first adder circuit to receive one of the first inverted sum value and the first inverted carry value. The second adder circuit outputs a second inverted sum value and a second inverted carry value.

19 Claims, 6 Drawing Sheets

(56) References Cited

OTHER PUBLICATIONS

Chip-Hong Chang, et al., Ultra Low-Voltage Low-Power CMOS 4-2 and 5-2 Compressors for Fast Arithmetic Circuits, IEEE Transactions on Circuits and Systems—I: Regular Papers, vol. 51, No. 10, Oct. 10, 2004, pp. 1985-1997.

Ahmed M. Shams, et al., "Performance Analysis of Low-Power 1-Bit CMOS Full Adder Cells", IEEE Transactions on Very Large Scale Integration (VLSI) Systems, vol. 10, No. 1, Feb. 2002, pp. 20-29.

Yi-Fong Lin, "A Novel Imprecise Compressor Design Used in DSP Multiplier" National Chung Hsing University Thesis of Master degree NCHU, Jul. 16, 2015, pp. 1-91.

\* cited by examiner

COMPRESSOR, ADDER CIRCUIT AND OPERATION METHOD THEREOF

CROSS-REFERENCE TO RELATED APPLICATION

This application claims the priority benefit of Taiwan patent application serial no. 109103609, filed on Feb. 6, 2020. The entirety of the above-mentioned patent application is hereby incorporated by reference here and made a part of this specification.

BACKGROUND OF THE INVENTION

1. Field of the Invention

The disclosure relates to an electronic circuit, and more particularly, to a compressor, an adder circuit, and an operation method thereof.

2. Description of Related Art

Compressors are often used in multipliers, image processing, and/or other applications. A compressor may be implemented by using a plurality of adders. Therefore, how to improve the compressor and the adder is one of the problems to be solved in the art.

SUMMARY OF THE INVENTION

The disclosure provides a compressor, an adder circuit, and an operation method thereof, to improve the compressor and the adder circuit.

The compressor of the disclosure includes a first adder circuit and a second adder circuit. A plurality of input terminals of the first adder circuit are configured to receive a plurality of input values. The first adder circuit outputs a first inverted sum value and a first inverted carry value, wherein the first inverted sum value is an inverted signal of a sum value obtained after an add operation is performed on the input values, and the first inverted carry value is an inverted signal of a carry value obtained after the add operation is performed on the input values. One of the plurality of input terminals of the second adder circuit is coupled to the first adder circuit to receive one of the first inverted sum value and the first inverted carry value. The second adder circuit outputs a second inverted sum value and a second inverted carry value, wherein the second inverted sum value is an inverted signal of a sum value obtained after an add operation is performed on signals of the input terminals of the second adder circuit, and the second inverted carry value is an inverted signal of a carry value obtained after the add operation is performed on the signals of the input terminals of the second adder circuit.

The adder circuit of the disclosure includes a carry circuit and an AND circuit. A plurality of input terminals of the carry circuit are configured to receive a plurality of input values of the adder circuit. An output terminal of the carry circuit outputs an inverted carry value, wherein the inverted carry value is an inverted signal of a carry value obtained after an add operation is performed on the input values. A plurality of input terminals of the AND circuit are configured to receive the input values. A control terminal of the AND circuit is configured to receive a control signal corresponding to the inverted carry value. An output terminal of the AND circuit outputs an inverted sum value, wherein the inverted sum value is an inverted signal of a sum value obtained after the add operation is performed on the input values.

The operation method of the disclosure includes the following step. A plurality of input values of the adder circuit are received by a carry circuit. An add operation is performed on the input values by the carry circuit to output an inverted carry value, wherein the inverted carry value is an inverted signal of a carry value obtained after the add operation is performed on the input values. The input values are received by an AND circuit. A control signal corresponding to the inverted carry value is received by the AND circuit. The add operation is performed on the input values according to the control signal by the AND circuit to output an inverted sum value, wherein the inverted sum value is an inverted signal of a sum value obtained after the add operation is performed on the input values.

Based on the above, the compressor according to the embodiments of the disclosure includes a first adder circuit and a second adder circuit. The adder circuit outputs an inverted signal of a sum value (an inverted sum value) and an inverted signal of a carry value (an inverted carry value). In some embodiments, a carry circuit of the adder circuit outputs the inverted carry value. An AND circuit of the adder circuit outputs the inverted sum value according to a control signal (the inverted carry value).

In order to make the above features and advantages of the present disclosure more comprehensible, embodiments are described below in detail with reference to the accompanying drawings.

DESCRIPTION OF THE EMBODIMENTS

Figure 1:
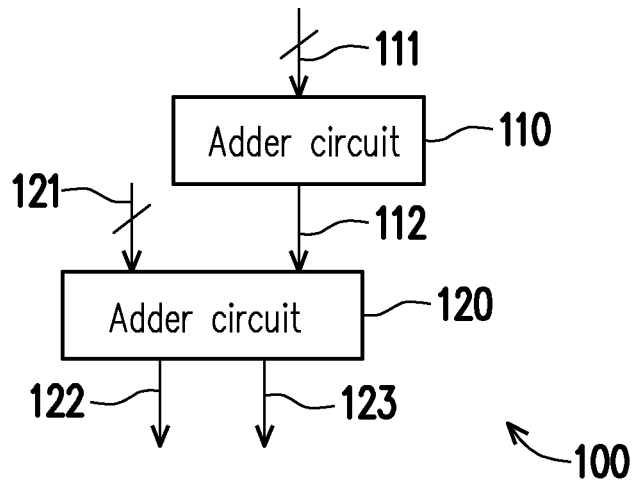
FIG. 1 is a schematic circuit block diagram of a compressor according to an embodiment of the disclosure.

The term "coupling (or connection)" used throughout the specification of the present disclosure (including the scope of patent application) can refer to any direct or indirect means of connection. For example, if a first device is described as being coupled (or connected) to a second device, it should be interpreted that the first device may be directly connected to the second device, or the first device may be indirectly connected to the second device through another device or a connection means. The terms "first" and "second" mentioned in the full text of the specification of the present disclosure (including the scope of patent application) are used to name the element, or to distinguish different embodiments or ranges, but not to limit the upper or lower limit of the quantity of elements, also not used to limit the order of the components. In addition, wherever possible, elements/components/steps using the same reference numerals are used in the drawings and embodiments to represent the same or similar parts. Components/components/steps using the same reference numerals or using the same terms in different embodiments may refer to related descriptions.

FIG. 1 is a schematic circuit block diagram of a compressor 100 according to an embodiment of the disclosure. The compressor 100 shown in FIG. 1 includes an adder circuit 110 and an adder circuit 120. The adder circuit 110 includes a plurality of input terminals, configured to receive a plurality of input values 111. The adder circuit 110 may output an inverted sum value and an inverted carry value. The inverted sum value of the adder circuit 110 is an inverted signal of a sum value obtained after an add operation is performed on the input values 111, and the inverted carry value of the adder circuit 110 is an inverted signal of a carry value obtained after the add operation is performed on the input values 111.

The adder circuit 110 may output an inverted value 112 to the adder circuit 120. The inverted value 112 is the inverted sum value or the inverted carry value of the adder circuit 110. One of a plurality of input terminals of the adder circuit 120 is coupled to the adder circuit 110 to receive the inverted value 112 (that is, one of the inverted sum value and the inverted carry value). Another input terminal of the adder circuit 120 receives an inverted input value 121. The inverted input value 121 is an inverted signal of the input value. The adder circuit 120 may output an inverted sum value and an inverted carry value. The inverted sum value of the adder circuit 120 is an inverted signal of a sum value obtained after an add operation is performed on signals of (that is, the inverted value 112 and the inverted input value 121) the input terminals of the adder circuit 120, and the inverted carry value of the adder circuit 120 is an inverted signal of a carry value obtained after the add operation is performed on the signals of (that is, the inverted value 112 and the inverted input value 121) the input terminals of the adder circuit 120.

For example, it is assumed that the input values of the compressor 100 include E, F, E1, and F1, and inverted signals of the input value E1 and the input value F1 are respectively an inverted input value E1B and an inverted input value F1B. The input values 111 may include the input value E and the input value F, and the inverted input values 121 may include the inverted input value E1B and the inverted input value F1B. An add operation of the input value E and the input value F is E+F=2*C+S, wherein C and S are respectively a carry value and a sum value, and inverted signals of the carry value C and the sum value S are respectively the inverted carry value CB and the inverted sum value SB. The adder circuit 110 may perform the add operation on the input value E and the input value F to output the inverted carry value CB and the inverted sum value SB. The inverted value 112 shown in FIG. 1 is one of the inverted sum value SB and the inverted carry value CB. The adder circuit 120 may perform an add operation on the inverted value 112, the inverted input value E1B and the inverted input value F1B to output an inverted carry value and an inverted sum value (that is, an output value 122 and an output value 123 of the compressor 100).

Figure 2:
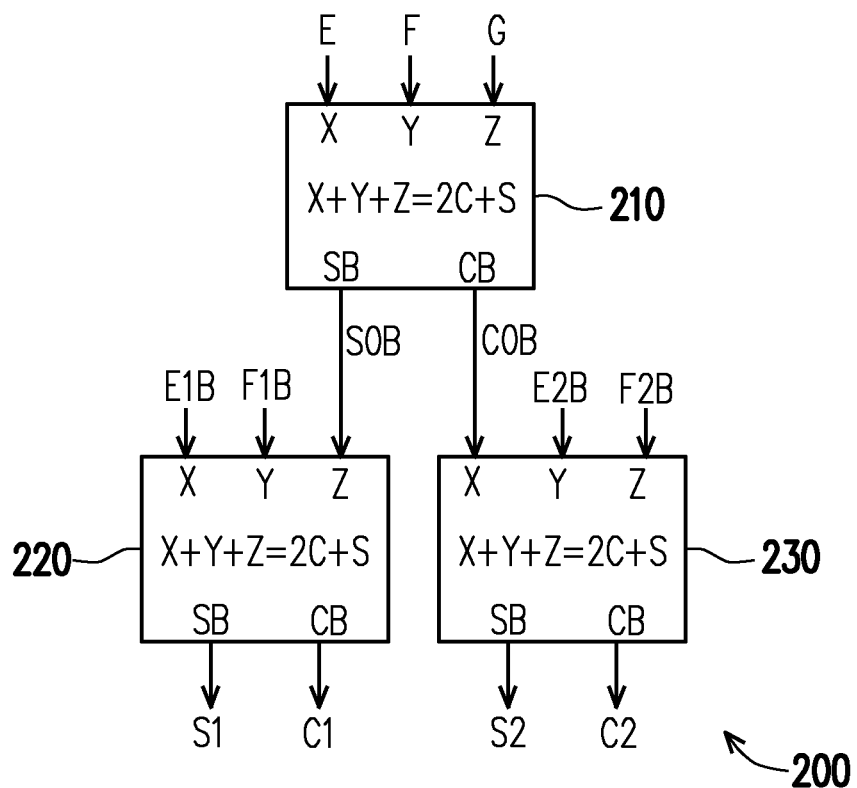
FIG. 2 is a schematic circuit block diagram of a compressor according to another embodiment of the disclosure.

FIG. 2 is a schematic circuit block diagram of a compressor 200 according to another embodiment of the disclosure. The compressor 200 shown in FIG. 2 includes an adder circuit 210, an adder circuit 220, and an adder circuit 230. For the adder circuit 210 shown in FIG. 2, reference may be made to the related description of the adder circuit 110 shown in FIG. 1. For the adder circuit 220 and the adder circuit 230 shown in FIG. 2, reference may be made to the related description of the adder circuit 120 shown in FIG. 1. It is assumed that the input values of the compressor 200 include E, F, G, E1, F1, E2 and F2, and inverted signals of the input value E1, the input value F1, the input value E2 and the input value F2 are respectively an inverted input value E1B, an inverted input value F1B, an inverted input value E2B and an inverted input value F2B.

The adder circuit 210 includes input terminals X, Y, and Z, configured to receive the input values E, F, G. An add operation of the input value E, the input value F and the input value G is E+F+G=2*C0+S0, wherein C0 and S0 are respectively a carry value and a sum value, and inverted signals of the carry value C0 and the sum value S0 are respectively an inverted carry value COB and an inverted sum value SOB. An output terminal SB of the adder circuit 210 may output the inverted sum value SOB to the adder circuit 220, and an output terminal CB of the adder circuit 210 may output the inverted carry value COB to the adder circuit 230.

The adder circuit 220 includes input terminals X, Y, and Z, configured to receive the inverted input value E1B, the inverted input value F1B, and the inverted sum value SOB. An add operation of the inverted input value E1B, the inverted input value F1B, and the inverted sum value SOB is E1B+F1B+S0B=2*C1B+S1B. Herein, C1B and S1B are respectively a carry value and a sum value, and inverted signals of the carry value C1B and the sum value S1B are respectively a carry value C1 and a sum value S1 of the compressor 200. The adder circuit 230 includes input terminals X, Y, and Z, configured to receive the inverted input value E2B, the inverted input value F2B, and the inverted carry value COB. An add operation of the inverted input value E2B, the inverted input value F2B, and the inverted carry value COB is E2B+F2B+C0B=2*C2B+S2B. Herein, C2B and S2B are respectively a carry value and a sum value, and inverted signals of the carry value C2B and the sum value S2B are respectively a carry value C2 and a sum value S2 of the compressor 200.

Figure 3:
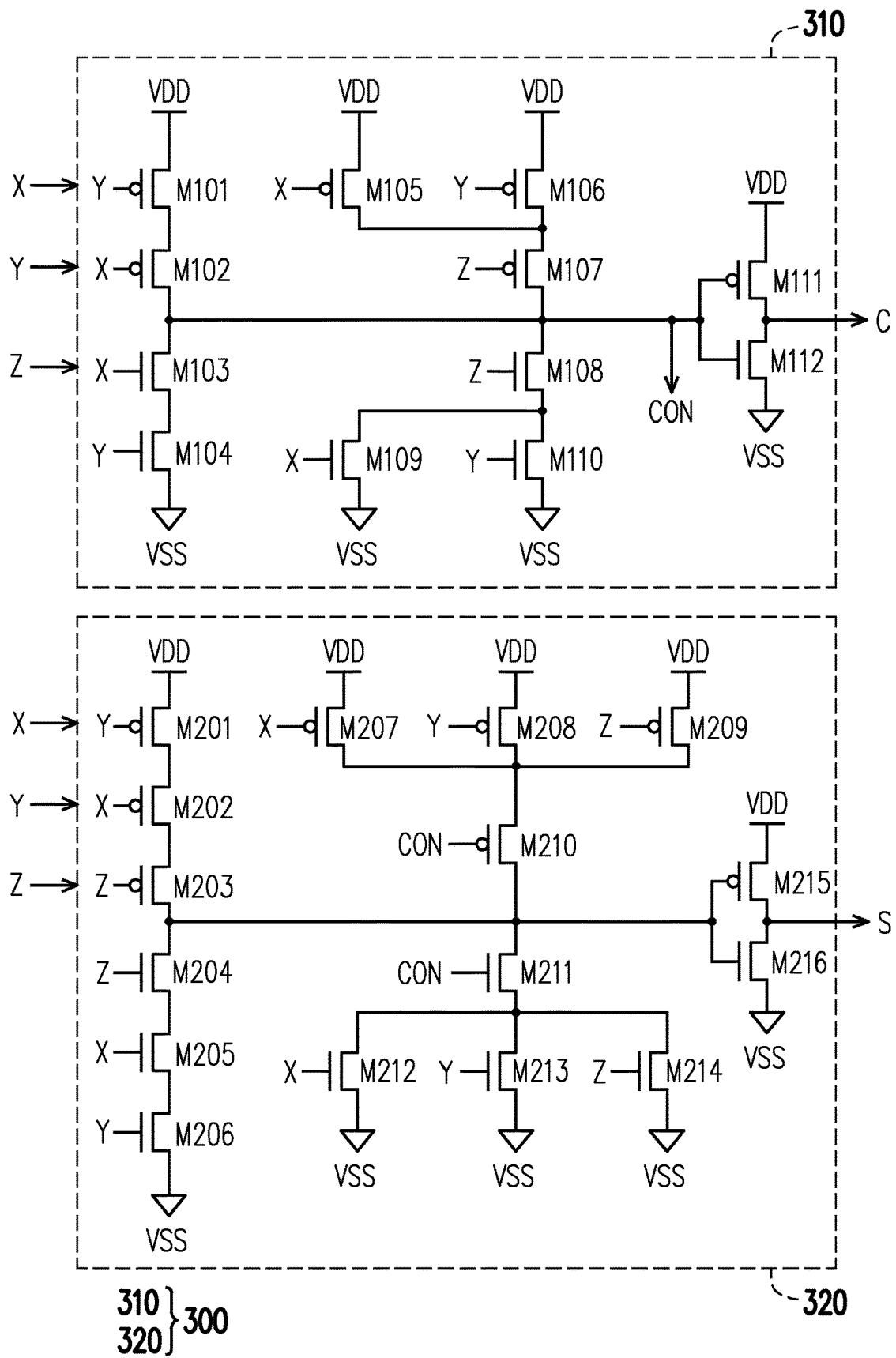
FIG. 3 is a schematic circuit block diagram of an adder circuit according to an embodiment.

FIG. 3 is a schematic circuit block diagram of an adder circuit 300 according to an embodiment. The adder circuit 300 shown in FIG. 3 includes a carry circuit 310 and an AND circuit 320. The carry circuit 310 includes a plurality of input terminals, for example, input terminals X, Y, and Z, configured to receive input values. An output terminal C of the carry circuit 310 outputs a carry value. In the embodiment shown in FIG. 3, the carry circuit 310 includes a transistor M101, a transistor M102, a transistor M103, a transistor M104, a transistor M105, a transistor M106, a transistor M107, a transistor M108, a transistor M109, a transistor M110, a transistor M111, and a transistor M112. According to design requirements, the transistor M101, the transistor M102, the transistor M105, the transistor M106, the transistor M107, and the transistor M111 may be p-channel metal oxide semiconductor (PMOS) transistors or other types of transistors. The transistor M103, the transistor M104, the transistor M108, the transistor M109, the transistor M110, and the transistor M112 may be n-channel metal oxide semiconductor (NMOS) transistors or other types of transistors.

A first terminal (for example, source) of the transistor M111 is coupled to a supply voltage VDD. A first terminal (for example, source) of the transistor M112 is coupled to a reference voltage VSS. Second terminals (for example, drains) of the transistor M111 and the transistor M112 are coupled to the output terminal C of the carry circuit 310.

Voltages of control terminals (for example, gates) of the transistor M111 and the transistor M112 may be provided to the AND circuit 320 as a control signal CON.

A first terminal (for example, source) of the transistor M101 is coupled to the supply voltage VDD. A first terminal (for example, source) of the transistor M102 is coupled to a second terminal (for example, drain) of the transistor M101. A second terminal (for example, drain) of the transistor M102 is coupled to the control terminals of the transistor M111 and the transistor M112. In the embodiment shown in FIG. 3, a control terminal (for example, gate) of the transistor M101 receives a second value signal of the input terminal Y, and a control terminal (for example, gate) of the transistor M102 receives a first value signal of the input terminal X. In other embodiments, the control terminal of the transistor M101 may receive the first value signal of the input terminal X, and the control terminal of the transistor M102 may receive the second value signal of the input terminal Y.

A first terminal (for example, drain) of the transistor M103 is coupled to the control terminals of the transistors M111 and M112. A first terminal (for example, drain) of the transistor M104 is coupled to a second terminal (for example, source) of the transistor M103. A second terminal (for example, source) of the transistor M104 is coupled to the reference voltage VSS. In the embodiment shown in FIG. 3, a control terminal (for example, gate) of the transistor M103 receives the first value signal of the input terminal X, and a control terminal (for example, gate) of the transistor M104 receives the second value signal of the input terminal Y. In other embodiments, the control terminal of the transistor M103 may receive the second value signal of the input terminal Y, and the control terminal of the transistor M104 may receive the first value signal of the input terminal X.

A first terminal (for example, source) of the transistor M105 is coupled to the supply voltage VDD. A control terminal (for example, gate) of the transistor M105 receives the first value signal of the input terminal X. A first terminal (for example, source) of the transistor M106 is coupled to the supply voltage VDD. A control terminal (for example, gate) of the transistor M106 receives the second value signal of the input terminal Y. A first terminal (for example, source) of the transistor M107 is coupled to a second terminal (for example, drain) of the transistor M105 a second terminal (for example, drain) of the transistor M106. A second terminal (for example, drain) of the transistor M107 is coupled to the control terminals of the transistors M111 and M112. A control terminal (for example, gate) of the transistor M107 receives a third value signal of the input terminal Z.

A first terminal (for example, drain) of the transistor M108 is coupled to the control terminals of the transistors M111 and M112. A control terminal (for example, gate) of the transistor M108 receives the third value signal of the input terminal Z. A first terminal (for example, drain) of the transistor M109 is coupled to a second terminal (for example, source) of the transistor M108. A second terminal (for example, source) of the transistor M109 is coupled to the reference voltage VSS. A control terminal (for example, gate) of the transistor M109 receives the first value signal of the input terminal X. A first terminal (for example, drain) of the transistor M110 is coupled to the second terminal of the transistor M108. A second terminal (for example, source) of the transistor M110 is coupled to the reference voltage VSS. A control terminal (for example, gate) of the transistor M110 receives the second value signal of the input terminal Y.

The AND circuit 320 includes a plurality of input terminals, for example, input terminals X, Y, and Z, configured to receive the input values. An output terminal S of the AND circuit 320 outputs a sum value. In the embodiment shown in FIG. 3, the AND circuit 320 includes a transistor M201, a transistor M202, a transistor M203, a transistor M204, a transistor M205, a transistor M206, a transistor M207, a transistor M208, a transistor M209, a transistor M210, a transistor M211, a transistor M212, a transistor M213, a transistor M214, a transistor M215, and a transistor M216. According to design requirements, the transistor M201, the transistor M202, the transistor M203, the transistor M207, the transistor M208, the transistor M209, the transistor M210, and the transistor M215 may be PMOS transistors or other types of transistors, and the transistor M204, the transistor M205, the transistor M206, the transistor M211. The transistor M212, the transistor M213, the transistor M214, and the transistor M216 may be NMOS transistors or other types of transistors.

A first terminal (for example, source) of the transistor M215 is coupled to the supply voltage VDD. A first terminal (for example, source) of the transistor M216 is coupled to the reference voltage VSS. Second terminals (for example, drains) of the transistor M215 and the transistor M216 are coupled to the output terminal S of the AND circuit 320.

A first terminal (for example, source) of the transistor M201 is coupled to the supply voltage VDD. A first terminal (for example, source) of the transistor M202 is coupled to a second terminal (for example, drain) of the transistor M201. A first terminal (for example, source) of the transistor M203 is coupled to a second terminal (for example, drain) of the transistor M202. A second terminal (for example, drain) of the transistor M203 is coupled to control terminals (for example, gates) of the transistor M215 and the transistor M216. A control terminal (for example, gate) of the transistor M201, a control terminal (for example, gate) of the transistor M202 and a control terminal (for example, gate) of the transistor M203 respectively receive the first value signal of the input terminal X, the second value signal of the input terminal Y and the third value signal of the input terminal Z.

A first terminal (for example, drain) of the transistor M204 is coupled to the control terminals of the transistor M215 and the transistor M216. A first terminal (for example, drain) of the transistor M205 is coupled to a second terminal (for example, source) of the transistor M204. A first terminal (for example, drain) of the transistor M206 is coupled to a second terminal (for example, source) of the transistor M205. A second terminal (for example, source) of the transistor M206 is coupled to the reference voltage VSS. A control terminal (for example, gate) of the transistor M204, a control terminal (for example, gate) of the transistor M205 and a control terminal (for example, gate) of the transistor M206 respectively receive the first value signal of the input terminal X, the second value signal of the input terminal Y and the third value signal of the input terminal Z.

A first terminal (for example, source) of the transistor M207 is coupled to the supply voltage VDD. A control terminal (for example, gate) of the transistor M207 receives the first value signal of the input terminal X. A first terminal (for example, source) of the transistor M208 is coupled to the supply voltage VDD. A control terminal (for example, gate) of the transistor M208 receives the second value signal of the input terminal Y. A first terminal (for example, source) of the transistor M209 is coupled to the supply voltage VDD. A control terminal (for example, gate) of the transistor M209 receives the third value signal of the input terminal Z. A first terminal (for example, source) of the transistor M210 is coupled to a second terminal (for example, drain) of the transistor M207, a second terminal (for example, drain) of the transistor M208 and a second terminal (for example, drain) of the transistor M209. A second terminal (for example, drain) of the transistor M210 is coupled to the control terminals of the transistor M215 and the transistor M216. A control terminal (for example, gate) of the transistor M210 is coupled to the carry circuit 310 to receive the control signal CON.

A first terminal (for example, drain) of the transistor M211 is coupled to the control terminals of the transistor M215 and the transistor M216. A control terminal (for example, gate) of the transistor M211 is coupled to the carry circuit 310 to receive the control signal CON. A first terminal (for example, drain) of the transistor M212 is coupled to a second terminal (for example, source) of the transistor M211. A second terminal (for example, source) of the transistor M212 is coupled to the reference voltage VSS. A control terminal (for example, gate) of the transistor M212 receives the first value signal of the input terminal X. A first terminal (for example, drain) of the transistor M213 is coupled to the second terminal of the transistor M211. A second terminal (for example, source) of the transistor M213 is coupled to the reference voltage VSS. A control terminal (for example, gate) of the transistor M213 receives the second value signal of the input terminal Y. A first terminal (for example, drain) of the transistor M214 is coupled to the second terminal of the transistor M211. A second terminal (for example, source) of the transistor M214 is coupled to the reference voltage VSS. A control terminal (for example, gate) of the transistor M214 receives the third value signal of the input terminal Z.

Figure 4:
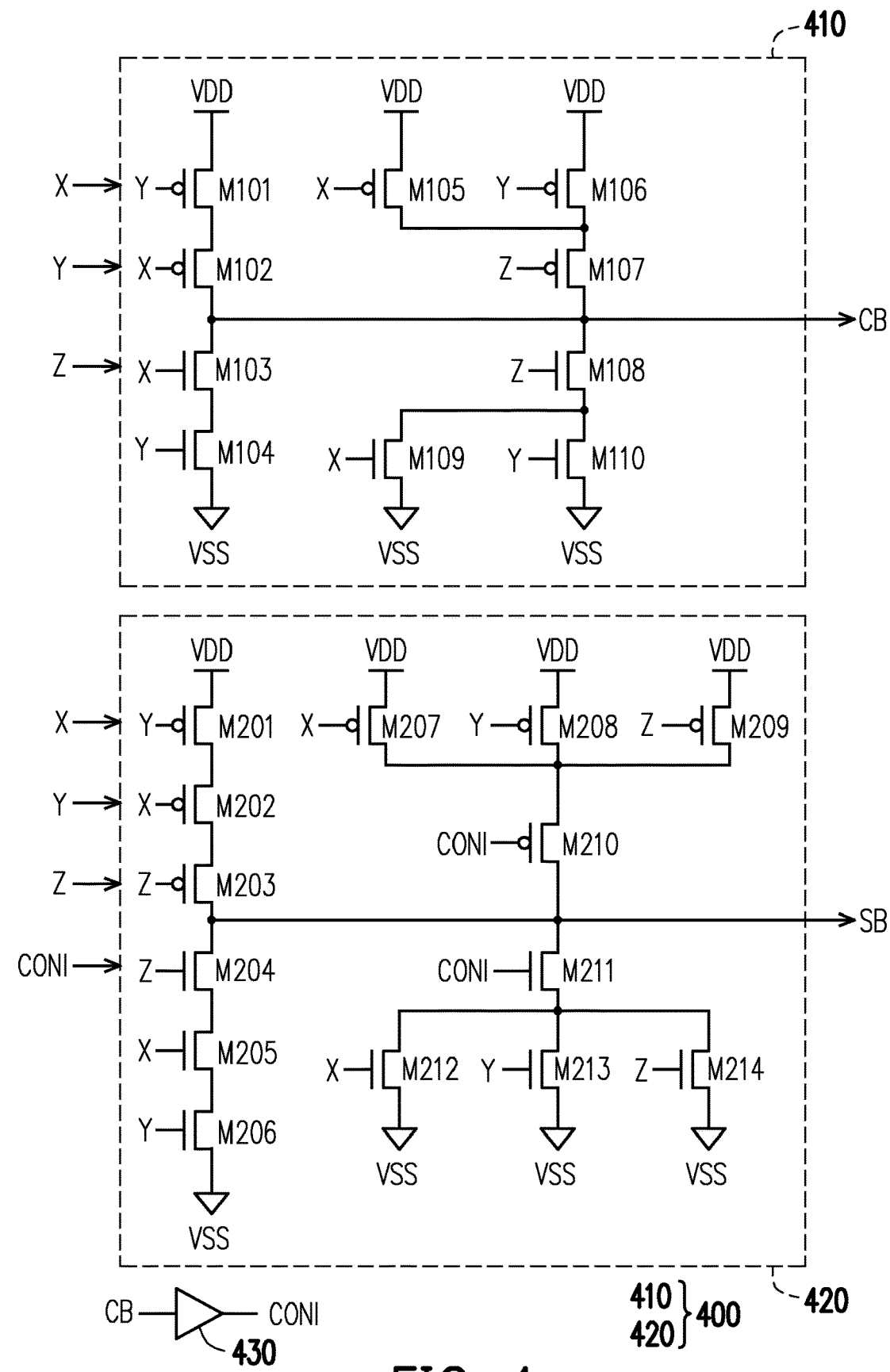
FIG. 4 is a schematic circuit block diagram of an adder circuit according to an embodiment of the disclosure.

FIG. 4 is a schematic circuit block diagram of an adder circuit 400 according to an embodiment of the disclosure. For the adder circuit 110 and (or) the adder circuit 120 shown in FIG. 1, reference may be made to the related description of the adder circuit 400 shown in FIG. 4. For the adder circuit 210, the adder circuit 220, and (or) the adder circuit 230 shown in FIG. 2, reference may be made to the related description of the adder circuit 400 shown in FIG. 4. The adder circuit 400 shown in FIG. 4 includes a carry circuit 410 and an AND circuit 420.

The carry circuit 410 includes a plurality of input terminals, respectively coupled to input terminals X, Y, and Z of the adder circuit 400 to receive input values. An output terminal of the carry circuit 410 is coupled to an output terminal CB of the adder circuit 400 to output an inverted carry value. In the embodiment shown in FIG. 4, the carry circuit 410 includes a transistor M101, a transistor M102, a transistor M103, a transistor M104, a transistor M105, a transistor M106, a transistor M107, a transistor M108, a transistor M109, and a transistor M110. For the transistors M101 to M110 shown in FIG. 4, reference may be made to the related description of FIG. 3, and the details will not be repeatedly described herein. Different from the embodiment shown in FIG. 3, the carry circuit 410 shown in FIG. 4 omits an inverter (that is, the transistor M111 and the transistor M112 shown in FIG. 3). Based on this, the second terminal of the transistor M102, the first terminal of the transistor M103, the second terminal of the transistor M107 and the first terminal of the transistor M108 are all coupled to the output terminal of the carry circuit 410, and thus coupled to the output terminal CB of the adder circuit 400.

The AND circuit 420 includes a plurality of input terminals, respectively coupled to the input terminals X, Y, and Z of the adder circuit 400 to receive the input values. An output terminal of the AND circuit 420 is coupled to an output terminal SB of the adder circuit 400 to output an inverted sum value. In the embodiment shown in FIG. 4, the AND circuit 420 includes a transistor M201, a transistor M202, a transistor M203, a transistor M204, a transistor M205, a transistor M206, a transistor M207, a transistor M208, a transistor M209, a transistor M210, a transistor M211, a transistor M212, a transistor M213, and a transistor M214. For the transistors M201 to M214 shown in FIG. 4, reference may be made to the related description of FIG. 3, and the details will not be repeatedly described herein.

Different from the embodiment shown in FIG. 3, the AND circuit 420 shown in FIG. 4 omits an inverter (that is, the transistor M215 and the transistor M216 shown in FIG. 3). Based on this, the second terminal of the transistor M203, the first terminal of the transistor M204, the second terminal of the transistor M210 and the first terminal of the transistor M211 are all coupled to the output terminal of the AND circuit 420, and thus coupled to the output terminal SB of the adder circuit 400.

In addition, the AND circuit 420 further includes a control terminal CONI (or, the adder circuit 400 further includes a control terminal CONI). The control terminal CONI may receive a control signal corresponding to the inverted carry value of the output terminal CB. Different from the embodiment shown in FIG. 3, control terminals (for example, gates) of the transistors M210 and M211 shown in FIG. 4 are coupled to the control terminal CONI of the AND circuit 420 to receive the control signal corresponding to the inverted carry value of the output terminal CB.

In the embodiment shown in FIG. 4, the adder circuit 400 further includes a gain circuit 430. According to design requirements, the gain circuit 430 may include a buffer, a logic gate, or other circuits/elements. An input terminal of the gain circuit 430 is coupled to the output terminal CB of the carry circuit 410 to receive the inverted carry value. An output terminal of the gain circuit 430 is coupled to the control terminal CONI of the AND circuit 420 to provide the control signal. In some other embodiments, the gain circuit 430 may be replaced with a lead wire. In other words, a first terminal of the lead wire is coupled to the output terminal CB of the carry circuit 410 to receive the inverted carry value, and a second terminal of the lead wire is coupled to the control terminal of the AND circuit 420 to provide the control signal.

Figure 5:
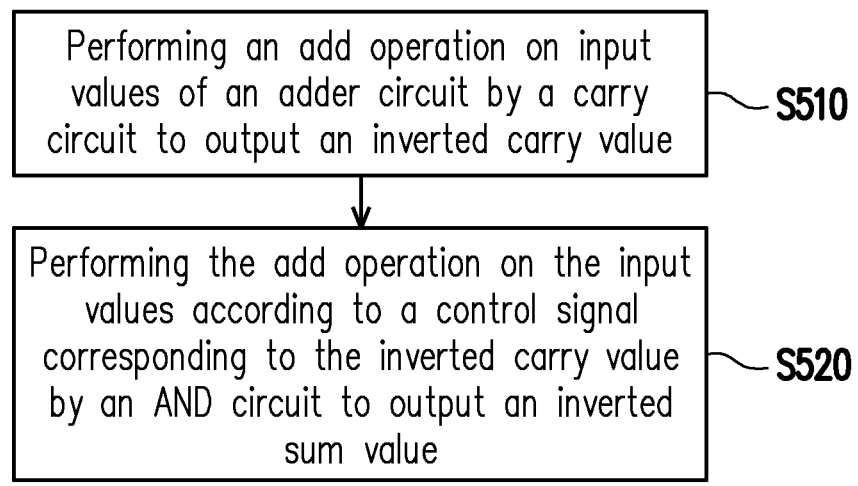
FIG. 5 is a schematic flow chart of an operation method of an adder circuit according to an embodiment of the disclosure.

FIG. 5 is a schematic flow chart of an operation method of an adder circuit according to an embodiment of the disclosure. Referring to FIG. 4 and FIG. 5, in step S510, the carry circuit 410 may receive a plurality of input values of the adder circuit 400 through the input terminals X, Y, and Z. The carry circuit 410 may perform an add operation on the input values of the adder circuit 400 to output an inverted carry value to the output terminal CB in step S510). The inverted carry value is an inverted signal of a carry value obtained after the add operation is performed on the input values. In step S520, the AND circuit 420 may receive the input values of the adder circuit 400. In addition, the control terminal CONI of the AND circuit 420 receives a control signal corresponding to the inverted carry value of the output terminal CB in step S520. The AND circuit 420 may perform an add operation on the input values of the adder circuit 400 according to the control signal to output an inverted sum value to the output terminal SB. The inverted sum value is an inverted signal of a sum value obtained after the add operation is performed on the input values.

Figure 6:
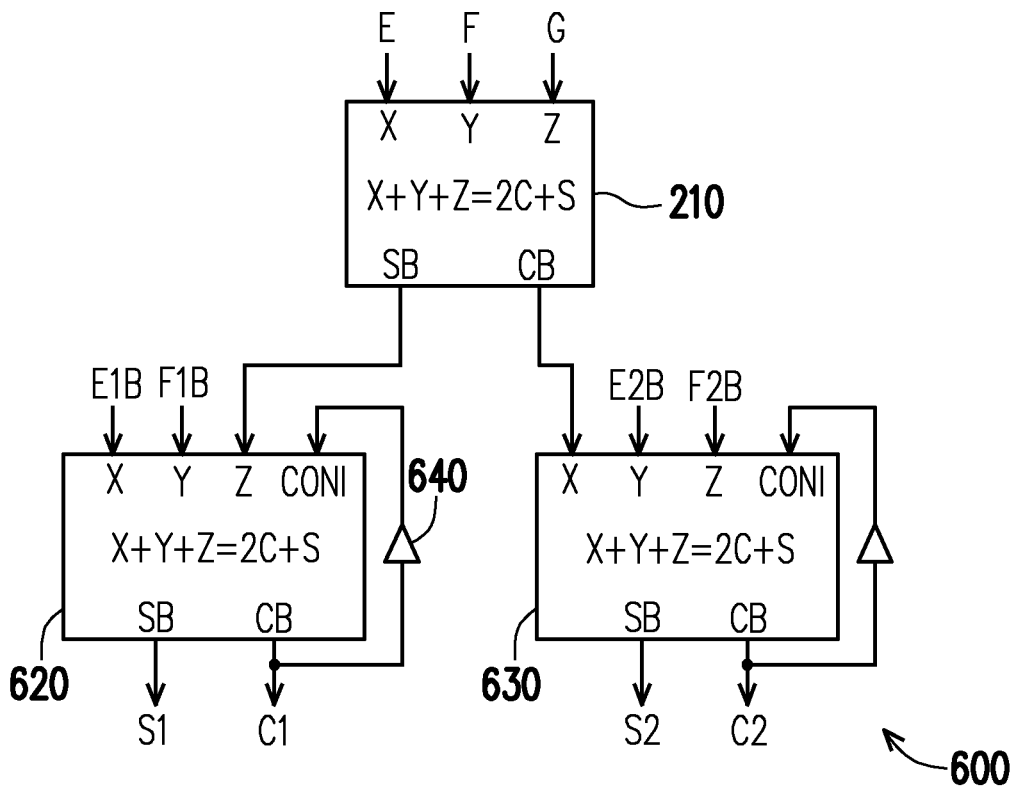
FIG. 6 is a schematic circuit block diagram of a compressor according to another embodiment of the disclosure.

FIG. 6 is a schematic circuit block diagram of a compressor 600 according to another embodiment of the disclosure. The compressor 600 shown in FIG. 6 includes an adder circuit 210, an adder circuit 620, and an adder circuit 630. For the adder circuit 210, the adder circuit 620, and the adder circuit 630 shown in FIG. 6, reference may be made to the related description of the adder circuit 210, the adder circuit 220 and the adder circuit 230 shown in FIG. 2. For the adder circuit 210 shown in FIG. 6, reference may be made to the related description of the adder circuit 400 shown in FIG. 4.

Different from the embodiment shown in FIG. 2, the adder circuit 620 shown in FIG. 6 further includes a control terminal CONI. For the adder circuit 630, reference may be made to the related description of the adder circuit 620, and the details will not be repeatedly described herein. The control terminal CONI may receive a control signal corresponding to an inverted carry value of the output terminal CB (a carry value C1 of the compressor 600). In a case where the gain circuit 430 shown in FIG. 4 is omitted, the adder circuit 400 shown in FIG. 4 may be used to implement the adder circuit 620.

In the embodiment shown in FIG. 6, the compressor 600 further includes a gain circuit 640. According to design requirements, the gain circuit 640 may include a buffer, a logic gate, or other circuits/elements. An input terminal of the gain circuit 640 is coupled to the output terminal CB of the adder circuit 620 to receive the inverted carry value (the carry value C1 of the compressor 600). An output terminal of the gain circuit 640 is coupled to the control terminal CONI of the adder circuit 620 to provide the control signal. In some other embodiments, the gain circuit 640 may be replaced with a lead wire. In other words, a first terminal of the lead wire is coupled to the output terminal CB of the adder circuit 620 to receive the inverted carry value (the carry value C1 of the compressor 600), and a second terminal of the lead wire is coupled to the control terminal CONI of the adder circuit 620 to provide the control signal.

Figure 7:
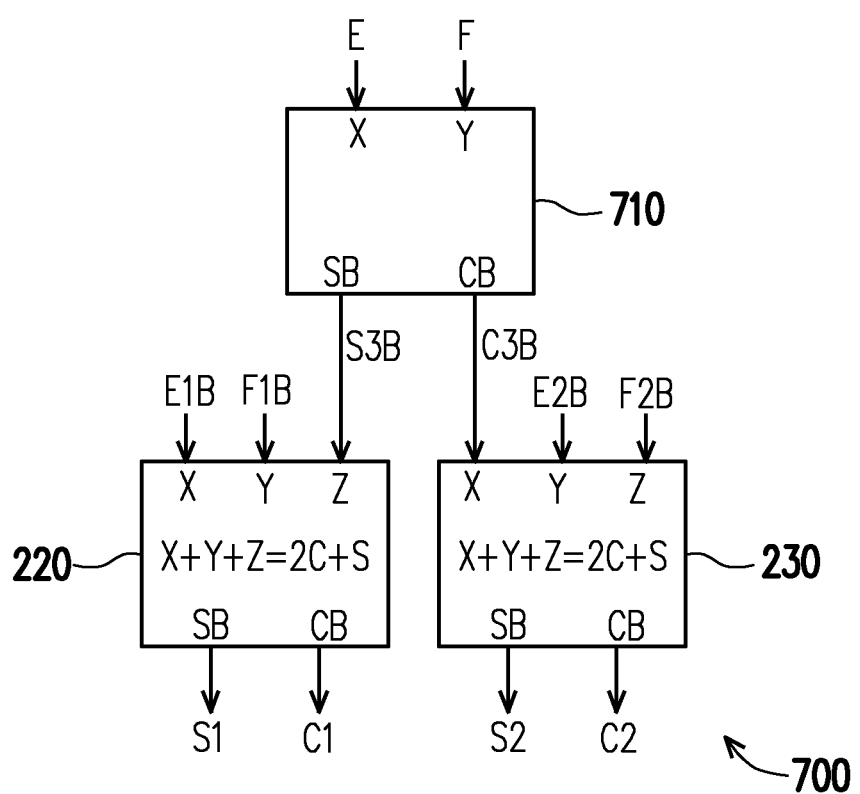
FIG. 7 is a schematic circuit block diagram of a compressor according to another embodiment of the disclosure.

FIG. 7 is a schematic circuit block diagram of a compressor 700 according to another embodiment of the disclosure. It is assumed that input values of the compressor 700 include E, F, E1, F1, E2, and F2, and inverted signals of the input value E1, the input value F1, the input value E2, and the input value F2 are respectively an inverted input value E1B, an inverted input value F1B, an inverted input value E2B, and an inverted input value F2B. The compressor 700 shown in FIG. 7 includes an adder circuit 710, an adder circuit 220, and an adder circuit 230. For the adder circuit 210 shown in FIG. 7, reference may be made to the related description of the adder circuit 110 shown in FIG. 1. For the adder circuit 220 and the adder circuit 230 shown in FIG. 7, reference may be made to the related description of the adder circuit 220 and the adder circuit 230 shown in FIG. 2, and the details will not be repeatedly described herein. In some other embodiments, for the adder circuit 220 and the adder circuit 230 shown in FIG. 7, reference may be made to the related description of the adder circuit 620 and the adder circuit 630 shown in FIG. 6.

In the embodiment shown in FIG. 7, the adder circuit 710 includes input terminals X and Y, configured to receive input values E and F. An add operation of the input value E and the input value F is E+F=2*C3+S3, wherein C3 and S3 are respectively a carry value and a sum value, and inverted signals of the carry value C3 and the sum value S3 are respectively an inverted carry value C3B and an inverted sum value S3B. An output terminal SB of the adder circuit 710 may output the inverted sum value S3B to the adder circuit 220, and an output terminal CB of the adder circuit 710 may output the inverted carry value C3B to the adder circuit 230.

Figure 8:
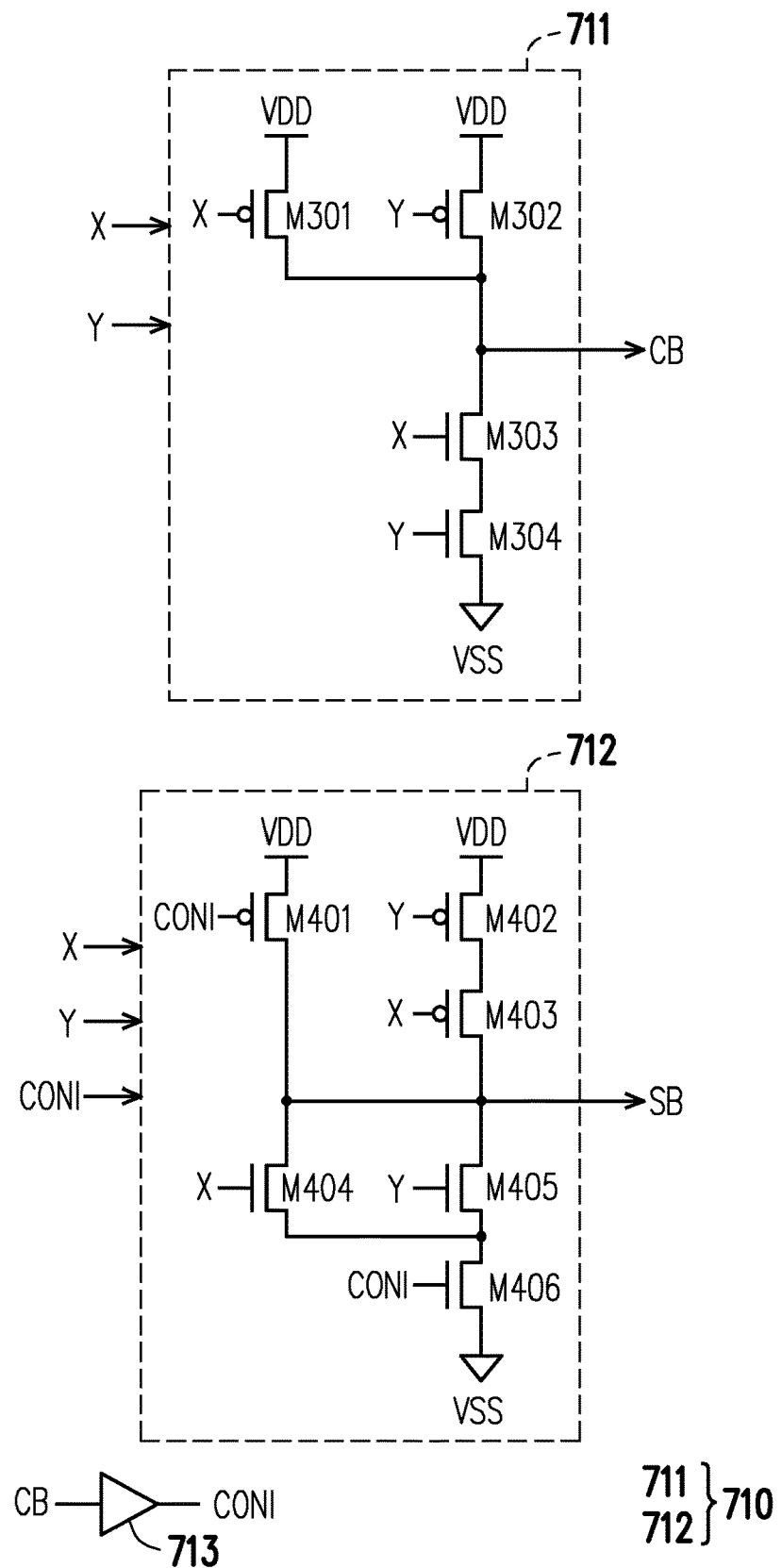
FIG. 8 is a schematic circuit block diagram of an adder circuit shown in FIG. 7 according to an embodiment.

FIG. 8 is a schematic circuit block diagram of the adder circuit 710 shown in FIG. 7 according to an embodiment. The adder circuit 710 shown in FIG. 8 includes a carry circuit 711 and an AND circuit 712. A plurality of input terminals of the carry circuit 711 are respectively coupled to the input terminals X and Y of the adder circuit 710 to receive the input values E and F. An output terminal of the carry circuit 711 is coupled to the output terminal CB of the adder circuit 710 to output the inverted carry value C3B. In the embodiment shown in FIG. 8, the carry circuit 711 includes a transistor M301, a transistor M302, a transistor M303, and a transistor M304. According to design requirements, the transistor M301 and the transistor M302 may be PMOS transistors or other types of transistors, and the transistor M303 and the transistor M304 may be NMOS transistors or other types of transistors.

A first terminal (for example, source) of the transistor M301 is coupled to a supply voltage VDD. A second terminal (for example, drain) of the transistor M301 is coupled to the output terminal of the carry circuit 711, to be specific, coupled to the output terminal CB of the adder circuit 710. A control terminal (for example, gate) of the transistor M301 receives a first value signal of the input terminal X. A first terminal (for example, source) of the transistor M302 is coupled to the supply voltage VDD. A second terminal (for example, drain) of the transistor M302 is coupled to the output terminal of the carry circuit 711, to be specific, coupled to the output terminal CB of the adder circuit 710. A control terminal (for example, gate) of the transistor M302 receives a second value signal of the input terminal Y. A first terminal (for example, drain) of the transistor M303 is coupled to the output terminal of the carry circuit 711, to be specific, coupled to the output terminal CB of the adder circuit 710. A first terminal (for example, drain) of the transistor M304 is coupled to a second terminal (for example, source) of the transistor M303. A second terminal (for example, source) of the transistor M304 is coupled to a reference voltage VSS. In the embodiment shown in FIG. 8, a control terminal (for example, gate) of the transistor M303 receives the first value signal of the input terminal X, and a control terminal (for example, gate) of the transistor M304 receives the second value signal of the input terminal Y. In other embodiments, the control terminal of the transistor M303 may receive the second value signal of the input terminal Y, and the control terminal of the transistor M304 may receive the first value signal of the input terminal X.

A plurality of input terminals of the AND circuit 712 are respectively coupled to the input terminals X and Y of the adder circuit 710 to receive the input values E and F. An output terminal of the AND circuit 712 is coupled to the output terminal SB of the adder circuit 710 to output the inverted sum value S3B. In addition, the AND circuit 712 further includes a control terminal CONI. The control terminal CONI may receive a control signal corresponding to the inverted carry value C3B of the output terminal CB. The AND circuit 712 may perform an add operation on the input values E and F of the adder circuit 710 according to the control signal to output the inverted sum value S3B to the output terminal SB.

In the embodiment shown in FIG. 8, the AND circuit 712 includes a transistor M401, a transistor M402, a transistor M403, a transistor M404, a transistor M405, and a transistor M406. According to design requirements, the transistor M401, the transistor M402, and the transistor M403 may be PMOS transistors or other types of transistors, and the transistor M404, the transistor M405, and the transistor M406 may be NMOS transistors or other types of transistors.

A first terminal (for example, source) of the transistor M401 is coupled to the supply voltage VDD. A second terminal (for example, drain) of the transistor M401 is coupled to the output terminal of the AND circuit 712, to be specific, coupled to the output terminal SB of the adder circuit 710. A control terminal (for example, gate) of the transistor M401 is coupled to the control terminal CONI of the AND circuit 712 to receive the control signal. A first terminal (for example, source) of the transistor M402 is coupled to the supply voltage VDD. A first terminal (for example, source) of the transistor M403 is coupled to a second terminal (for example, drain) of the transistor M402. A second terminal (for example, drain) of the transistor M403 is coupled to the output terminal of the AND circuit 712, to be specific, coupled to the output terminal SB of the adder circuit 710. In the embodiment shown in FIG. 8, a control terminal (for example, gate) of the transistor M402 receives the second value signal of the input terminal Y, and a control terminal (for example, gate) of the transistor M403 receives the first value signal of the input terminal X. In other embodiments, the control terminal of the transistor M402 may receive the first value signal of the input terminal X, and the control terminal of the transistor M403 may receive the second value signal of the input terminal Y.

A first terminal (for example, drain) of the transistor M404 is coupled to the output terminal of the AND circuit 712, to be specific, coupled to the output terminal SB of the adder circuit 710. A control terminal (for example, gate) of the transistor M404 receives the first value signal of the input terminal X. A first terminal (for example, drain) of the transistor M405 is coupled to the output terminal of the AND circuit 712, to be specific, coupled to the output terminal SB of the adder circuit 710. A control terminal (for example, gate) of the transistor M405 receives the second value signal of the input terminal Y. A first terminal (for example, drain) of the transistor M406 is coupled to a second terminal (for example, source) of the transistor M404 and a second terminal (for example, source) of the transistor M405. A second terminal (for example, source) of the transistor M406 is coupled to the reference voltage VSS. A control terminal (for example, gate) of the transistor M406 is coupled to the control terminal CONI of the AND circuit 712 to receive the control signal.

In the embodiment shown in FIG. 8, the adder circuit 710 further includes a gain circuit 713. According to design requirements, the gain circuit 713 may include a buffer, a logic gate or other circuits/elements. An input terminal of the gain circuit 713 is coupled to the output terminal CB of the carry circuit 711 to receive the inverted carry value. An output terminal of the gain circuit 713 is coupled to the control terminal CONI of the AND circuit 712 to provide the control signal. In some other embodiments, the gain circuit 713 may be replaced with a lead wire. In other words, a first terminal of the lead wire is coupled to the output terminal CB of the carry circuit 711 to receive the inverted carry value, and a second terminal of the lead wire is coupled to the control terminal of the AND circuit 712 to provide the control signal.

In conclusion, the compressor according to the embodiments of the disclosure includes a plurality of adder circuits. The adder circuits output an inverted signal of a sum value (inverted sum value), and an inverted signal of a carry value (inverted carry value). By comparing FIG. 3 with FIG. 4, the carry circuit 410 shown in FIG. 4 omits an inverter (that is, the transistor M111 and the transistor M112 shown in FIG. 3), and the AND circuit 420 shown in FIG. 4 omits an inverter (that is, the transistor M215 and the transistor M216 shown in FIG. 3). Therefore, the adder circuit 400 shown in FIG. 4 may reduce power consumption and increase the computing speed.

Although the present disclosure has been disclosed as above with the examples, it is not intended to limit the present disclosure. Any person with ordinary knowledge in the technical field can make some modifications and retouching without departing from the spirit and scope of the present disclosure. The protection scope of the present disclosure shall be determined by the scope of the attached patent application.

What is claimed is:

1. A compressor, comprising:
   a first adder circuit, comprising a plurality of input terminals configured to receive a plurality of input values, wherein the first adder circuit outputs a first inverted sum value and a first inverted carry value, the first inverted sum value is an inverted signal of a sum value obtained after an add operation is performed on the input values, and the first inverted carry value is an inverted signal of a carry value obtained after the add operation is performed on the input values; and
   a second adder circuit, comprising a plurality of input terminals, wherein one of the input terminals of the second adder circuit is coupled to the first adder circuit to receive one of the first inverted sum value and the first inverted carry value, the second adder circuit outputs a second inverted sum value and a second inverted carry value, the second inverted sum value is an inverted signal of a sum value obtained after an add operation is performed on signals of the input terminals of the second adder circuit, and the second inverted carry value is an inverted signal of a carry value obtained after the add operation is performed on the signals of the input terminals of the second adder circuit.

2. The compressor according to claim 1, wherein the first adder circuit comprises:
   a carry circuit, comprising a plurality of input terminals configured to receive the input values, wherein an output terminal of the carry circuit outputs the first inverted carry value; and
   an AND circuit, comprising a plurality of input terminals configured to receive the input values and a control terminal configured to receive a control signal corresponding to the first inverted carry value, wherein an output terminal of the AND circuit outputs the first inverted sum value.

3. The compressor according to claim 2, wherein the first adder circuit further comprises:
   a gain circuit, comprising an input terminal coupled to the output terminal of the carry circuit to receive the first inverted carry value, wherein an output terminal of the gain circuit is coupled to the control terminal of the AND circuit to provide the control signal.

4. The compressor according to claim 2, wherein the first adder circuit further comprises:
   a lead wire, comprising a first terminal coupled to the output terminal of the carry circuit to receive the first inverted carry value, wherein a second terminal of the lead wire is coupled to the control terminal of the AND circuit to provide the control signal.

5. The compressor according to claim 2, wherein the input values comprise a first value signal and a second value signal, and the carry circuit comprises:
- a first transistor, comprising a first terminal coupled to a supply voltage, wherein a second terminal of the first transistor is coupled to the output terminal of the carry circuit, and a control terminal of the first transistor receives the first value signal;
- a second transistor, comprising a first terminal coupled to the supply voltage, wherein a second terminal of the second transistor is coupled to the output terminal of the carry circuit, and the control terminal of the second transistor receives the second value signal;
- a third transistor, comprising a first terminal coupled to the output terminal of the carry circuit; and
- a fourth transistor, comprising a first terminal coupled to a second terminal of the third transistor, wherein a second terminal of the fourth transistor is coupled to a reference voltage, a control terminal of the fourth transistor receives the second value signal when a control terminal of the third transistor receives the first value signal, and the control terminal of the fourth transistor receives the first value signal when the control terminal of the third transistor receives the second value signal.

6. The compressor according to claim 2, wherein the input values comprise a first value signal and a second value signal, and the AND circuit comprises:
- a first transistor, comprising a first terminal coupled to a supply voltage, wherein a second terminal of the first transistor is coupled to the output terminal of the AND circuit, and a control terminal of the first transistor is coupled to the control terminal of the AND circuit to receive the control signal;
- a second transistor, comprising a first terminal coupled to the supply voltage;
- a third transistor, comprising a first terminal coupled to a second terminal of the second transistor, wherein a second terminal of the third transistor is coupled to the output terminal of the AND circuit, a control terminal of the third transistor receives the second value signal when a control terminal of the second transistor receives the first value signal, and the control terminal of the third transistor receives the first value signal when the control terminal of the second transistor receives the second value signal;
- a fourth transistor, comprising a first terminal coupled to the output terminal of the AND circuit, wherein a control terminal of the fourth transistor receives the first value signal;
- a fifth transistor, comprising a first terminal coupled to the output terminal of the AND circuit, wherein a control terminal of the fifth transistor receives the second value signal; and
- a sixth transistor, comprising a first terminal coupled to a second terminal of the fourth transistor and a second terminal of the fifth transistor, wherein a second terminal of the sixth transistor is coupled to a reference voltage, and a control terminal of the sixth transistor is coupled to the control terminal of the AND circuit to receive the control signal.

7. The compressor according to claim 2, wherein the input values comprise a first value signal, a second value signal, and a third value signal, and the carry circuit comprises:
- a first transistor, comprising a first terminal coupled to a supply voltage;
- a second transistor, comprising a first terminal coupled to a second terminal of the first transistor, wherein a second terminal of the second transistor is coupled to the output terminal of the carry circuit, a control terminal of the second transistor receives the second value signal when a control terminal of the first transistor receives the first value signal, and the control terminal of the second transistor receives the first value signal when the control terminal of the first transistor receives the second value signal;
- a third transistor, comprising a first terminal coupled to the output terminal of the carry circuit;
- a fourth transistor, comprising a first terminal coupled to a second terminal of the third transistor, wherein a second terminal of the fourth transistor is coupled to a reference voltage, a control terminal of the fourth transistor receives the second value signal when a control terminal of the third transistor receives the first value signal, and the control terminal of the fourth transistor receives the first value signal when the control terminal of the third transistor receives the second value signal;
- a fifth transistor, comprising a first terminal coupled to the supply voltage, wherein a control terminal of the fifth transistor receives the first value signal;
- a sixth transistor, comprising a first terminal coupled to the supply voltage, wherein a control terminal of the sixth transistor receives the second value signal;
- a seventh transistor, comprising a first terminal coupled to a second terminal of the fifth transistor and a second terminal of the sixth transistor, wherein a second terminal of the seventh transistor is coupled to the output terminal of the carry circuit, and a control terminal of the seventh transistor receives the third value signal;
- an eighth transistor, comprising a first terminal coupled to the output terminal of the carry circuit, wherein a control terminal of the eighth transistor receives the third value signal;
- a ninth transistor, comprising a first terminal coupled to a second terminal of the eighth transistor, wherein a second terminal of the ninth transistor is coupled to the reference voltage, and a control terminal of the ninth transistor receives the first value signal; and
- a tenth transistor, comprising a first terminal coupled to the second terminal of the eighth transistor, wherein a second terminal of the tenth transistor is coupled to the reference voltage, and a control terminal of the tenth transistor receives the second value signal.

8. The compressor according to claim 2, wherein the input values comprise a first value signal, a second value signal, and a third value signal, and the AND circuit comprises:
- a first transistor, comprising a first terminal coupled to a supply voltage;
- a second transistor, comprising a first terminal coupled to a second terminal of the first transistor;
- a third transistor, comprising a first terminal coupled to a second terminal of the second transistor, wherein a second terminal of the third transistor is coupled to the output terminal of the AND circuit, and a control terminal of the first transistor, a control terminal of the second transistor, and a control terminal of the third transistor respectively receive the first value signal, the second value signal, and the third value signal;
- a fourth transistor, comprising a first terminal coupled to the output terminal of the AND circuit;
- a fifth transistor, comprising a first terminal coupled to a second terminal of the fourth transistor;

a sixth transistor, comprising a first terminal coupled to a second terminal of the fifth transistor, wherein a second terminal of the sixth transistor is coupled to a reference voltage, and a control terminal of the fourth transistor, a control terminal of the fifth transistor, and a control terminal of the sixth transistor respectively receive the first value signal, the second value signal, and the third value signal;

a seventh transistor, comprising a first terminal coupled to the supply voltage, wherein a control terminal of the seventh transistor receives the first value signal;

an eighth transistor, comprising a first terminal coupled to the supply voltage, wherein a control terminal of the eighth transistor receives the second value signal;

a ninth transistor, comprising a first terminal coupled to the supply voltage, wherein a control terminal of the ninth transistor receives the third value signal;

a tenth transistor, comprising a first terminal coupled to a second terminal of the seventh transistor, a second terminal of the eighth transistor, and a second terminal of the ninth transistor, wherein a second terminal of the tenth transistor is coupled to the output terminal of the AND circuit, and a control terminal of the tenth transistor is coupled to the control terminal of the AND circuit to receive the control signal;

an eleventh transistor, comprising a first terminal coupled to the output terminal of the AND circuit, wherein a control terminal of the eleventh transistor is coupled to the control terminal of the AND circuit to receive the control signal;

a twelfth transistor, comprising a first terminal coupled to a second terminal of the eleventh transistor, wherein a second terminal of the twelfth transistor is coupled to the reference voltage, and a control terminal of the twelfth transistor receives the first value signal;

a thirteenth transistor, comprising a first terminal coupled to the second terminal of the eleventh transistor, wherein a second terminal of the thirteenth transistor is coupled to the reference voltage, and a control terminal of the thirteenth transistor receives the second value signal; and a fourteenth transistor, comprising a first terminal coupled to the second terminal of the eleventh transistor, wherein a second terminal of the fourteenth transistor is coupled to the reference voltage, and a control terminal of the fourteenth transistor receives the third value signal.

9. The compressor according to claim 1, wherein the second adder circuit further comprises a control terminal, configured to receive a control signal corresponding to the second inverted carry value.

10. The compressor according to claim 9, further comprising:
a gain circuit, comprising an input terminal coupled to the second adder circuit to receive the second inverted carry value, wherein an output terminal of the gain circuit is coupled to the control terminal of the second adder circuit to provide the control signal.

11. The compressor according to claim 9, further comprising:
a lead wire, comprising a first terminal coupled to the second adder circuit to receive the second inverted carry value, wherein a second terminal of the lead wire is coupled to the control terminal of the second adder circuit to provide the control signal.

12. The compressor according to claim 1, further comprising:

a third adder circuit, comprising a plurality of input terminals, wherein one of the input terminals of the third adder circuit is coupled to the first adder circuit to receive the other one of the first inverted sum value and the first inverted carry value, the third adder circuit outputs a third inverted sum value and a third inverted carry value, the third inverted sum value is an inverted signal of a sum value obtained after an add operation is performed on signals of the input terminals of the third adder circuit, and the third inverted carry value is an inverted signal of a carry value obtained after the add operation is performed on the signals of the input terminals of the third adder circuit.

13. An adder circuit, comprising:
a carry circuit, comprising a plurality of input terminals configured to receive a plurality of input values of the adder circuit, wherein an output terminal of the carry circuit outputs an inverted carry value, and the inverted carry value is an inverted signal of a carry value obtained after an add operation is performed on the input values; and an AND circuit, comprising a plurality of input terminals configured to receive the input values and a control terminal configured to receive a control signal corresponding to the inverted carry value, wherein an output terminal of the AND circuit outputs an inverted sum value, and the inverted sum value is an inverted signal of a sum value obtained after the add operation is performed on the input values, wherein the input values comprise a first value signal and a second value signal, and the carry circuit comprises:
a first transistor, comprising a first terminal coupled to a supply voltage, wherein a second terminal of the first transistor is coupled to the output terminal of the carry circuit, and a control terminal of the first transistor receives the first value signal;

a second transistor, comprising a first terminal coupled to the supply voltage, wherein a second terminal of the second transistor is coupled to the output terminal of the carry circuit, and the control terminal of the second transistor receives the second value signal;

a third transistor, comprising a first terminal coupled to the output terminal of the carry circuit; and a fourth transistor, comprising a first terminal coupled to a second terminal of the third transistor, wherein a second terminal of the fourth transistor is coupled to a reference voltage, a control terminal of the fourth transistor receives the second value signal when a control terminal of the third transistor receives the first value signal, and the control terminal of the fourth transistor receives the first value signal when the control terminal of the third transistor receives the second value signal.

14. The adder circuit according to claim 13, further comprising:
a gain circuit, comprising an input terminal coupled to the output terminal of the carry circuit to receive the inverted carry value, wherein an output terminal of the gain circuit is coupled to the control terminal of the AND circuit to provide the control signal.

15. The adder circuit according to claim 13, further comprising:
a lead wire, comprising a first terminal coupled to the output terminal of the carry circuit to receive the inverted carry value, wherein a second terminal of the lead wire is coupled to the control terminal of the AND circuit to provide the control signal.

16. The adder circuit according to claim 13, wherein the AND circuit comprises:
   a first transistor device, comprising a first terminal coupled to a supply voltage, wherein a second terminal of the first transistor device is coupled to the output terminal of the AND circuit, and a control terminal of the first transistor device is coupled to the control terminal of the AND circuit to receive the control signal;
   a second transistor device, comprising a first terminal coupled to the supply voltage;
   a third transistor device, comprising a first terminal coupled to a second terminal of the second transistor device, wherein a second terminal of the third transistor device is coupled to the output terminal of the AND circuit, a control terminal of the third transistor device receives the second value signal when a control terminal of the second transistor device receives the first value signal, and the control terminal of the third transistor device receives the first value signal when the control terminal of the second transistor device receives the second value signal;
   a fourth transistor device, comprising a first terminal coupled to the output terminal of the AND circuit, wherein a control terminal of the fourth transistor device receives the first value signal;
   a fifth transistor device, comprising a first terminal coupled to the output terminal of the AND circuit, wherein a control terminal of the fifth transistor device receives the second value signal; and
   a sixth transistor device, comprising a first terminal coupled to a second terminal of the fourth transistor device and a second terminal of the fifth transistor device, wherein a second terminal of the sixth transistor device is coupled to a reference voltage, and a control terminal of the sixth transistor device is coupled to the control terminal of the AND circuit to receive the control signal.

17. An adder circuit, comprising:
   a carry circuit, comprising a plurality of input terminals configured to receive a plurality of input values of the adder circuit, wherein an output terminal of the carry circuit outputs an inverted carry value, and the inverted carry value is an inverted signal of a carry value obtained after an add operation is performed on the input values; and
   an AND circuit, comprising a plurality of input terminals configured to receive the input values and a control terminal configured to receive a control signal corresponding to the inverted carry value, wherein an output terminal of the AND circuit outputs an inverted sum value, and the inverted sum value is an inverted signal of a sum value obtained after the add operation is performed on the input values,
   wherein the input values comprise a first value signal, a second value signal, and a third value signal, and the carry circuit comprises:
      a first transistor device, comprising a first terminal coupled to a supply voltage;
      a second transistor device, comprising a first terminal coupled to a second terminal of the first transistor device, wherein a second terminal of the second transistor device is coupled to the output terminal of the carry circuit, a control terminal of the second transistor device receives the second value signal when a control terminal of the first transistor device receives the first value signal, and the control terminal of the second transistor device receives the first value signal when the control terminal of the first transistor device receives the second value signal;
      a third transistor device, comprising a first terminal coupled to the output terminal of the carry circuit;
      a fourth transistor device, comprising a first terminal coupled to a second terminal of the third transistor device, wherein a second terminal of the fourth transistor device is coupled to a reference voltage, a control terminal of the fourth transistor device receives the second value signal when a control terminal of the third transistor device receives the first value signal, and the control terminal of the fourth transistor device receives the first value signal when the control terminal of the third transistor device receives the second value signal;
      a fifth transistor device, comprising a first terminal coupled to the supply voltage, wherein a control terminal of the fifth transistor device receives the first value signal;
      a sixth transistor device, comprising a first terminal coupled to the supply voltage, wherein a control terminal of the sixth transistor device receives the second value signal;
      a seventh transistor device, comprising a first terminal coupled to a second terminal of the fifth transistor device and a second terminal of the sixth transistor device, wherein a second terminal of the seventh transistor device is coupled to the output terminal of the carry circuit, and a control terminal of the seventh transistor device receives the third value signal;
      an eighth transistor device, comprising a first terminal coupled to the output terminal of the carry circuit, wherein a control terminal of the eighth transistor device receives the third value signal;
      a ninth transistor device, comprising a first terminal coupled to a second terminal of the eighth transistor device, wherein a second terminal of the ninth transistor device is coupled to the reference voltage, and a control terminal of the ninth transistor device receives the first value signal; and
      a tenth transistor device, comprising a first terminal coupled to the second terminal of the eighth transistor device, wherein a second terminal of the tenth transistor device is coupled to the reference voltage, and a control terminal of the tenth transistor device receives the second value signal.

18. The adder circuit according to claim 17, wherein the AND circuit comprises:
   a first transistor, comprising a first terminal coupled to a supply voltage;
   a second transistor, comprising a first terminal coupled to a second terminal of the first transistor;
   a third transistor, comprising a first terminal coupled to a second terminal of the second transistor, wherein a second terminal of the third transistor is coupled to the output terminal of the AND circuit, and a control terminal of the first transistor, a control terminal of the second transistor, and a control terminal of the third transistor respectively receive the first value signal, the second value signal, and the third value signal;
   a fourth transistor, comprising a first terminal coupled to the output terminal of the AND circuit;
   a fifth transistor, comprising a first terminal coupled to a second terminal of the fourth transistor;

a sixth transistor, comprising a first terminal coupled to a second terminal of the fifth transistor, wherein a second terminal of the sixth transistor is coupled to a reference voltage, and a control terminal of the sixth transistor, a control terminal of the fifth transistor, and a control terminal of the fourth transistor respectively receive the first value signal, the second value signal, and the third value signal;

a seventh transistor, comprising a first terminal coupled to the supply voltage, wherein a control terminal of the seventh transistor receives the first value signal;

an eighth transistor, comprising a first terminal coupled to the supply voltage, wherein a control terminal of the eighth transistor receives the second value signal;

a ninth transistor, comprising a first terminal coupled to the supply voltage, wherein a control terminal of the ninth transistor receives the third value signal;

a tenth transistor, comprising a first terminal coupled to a second terminal of the seventh transistor, a second terminal of the eighth transistor, and a second terminal of the ninth transistor, wherein a second terminal of the tenth transistor is coupled to the output terminal of the AND circuit, and a control terminal of the tenth transistor is coupled to the control terminal of the AND circuit to receive the control signal;

an eleventh transistor, comprising a first terminal coupled to the output terminal of the AND circuit, wherein a control terminal of the eleventh transistor is coupled to the control terminal of the AND circuit to receive the control signal;

a twelfth transistor, comprising a first terminal coupled to a second terminal of the eleventh transistor, wherein a second terminal of the twelfth transistor is coupled to the reference voltage, and a control terminal of the twelfth transistor receives the first value signal;

a thirteenth transistor, comprising a first terminal coupled to the second terminal of the eleventh transistor, wherein a second terminal of the thirteenth transistor is coupled to the reference voltage, and a control terminal of the thirteenth transistor receives the second value signal; and a fourteenth transistor, comprising a first terminal coupled to the second terminal of the eleventh transistor, wherein a second terminal of the fourteenth transistor is coupled to the reference voltage, and a control terminal of the fourteenth transistor receives the third value signal.

19. An operation method of an adder circuit, comprising:

receiving a plurality of input values of the adder circuit by a carry circuit;

performing an add operation on the input values by the carry circuit to output an inverted carry value, wherein the inverted carry value is an inverted signal of a carry value obtained after the add operation is performed on the input values;

receiving the input values by an AND circuit;

receiving a control signal corresponding to the inverted carry value by the AND circuit; and performing the add operation on the input values according to the control signal by the AND circuit to output an inverted sum value, wherein the inverted sum value is an inverted signal of a sum value obtained after the add operation is performed on the input values, wherein the input values comprise a first value signal and a second value signal, and the carry circuit comprises:

a first transistor, comprising a first terminal coupled to a supply voltage, wherein a second terminal of the first transistor is coupled to the output terminal of the carry circuit, and a control terminal of the first transistor receives the first value signal;

a second transistor, comprising a first terminal coupled to the supply voltage, wherein a second terminal of the second transistor is coupled to the output terminal of the carry circuit, and the control terminal of the second transistor receives the second value signal;

a third transistor, comprising a first terminal coupled to the output terminal of the carry circuit; and a fourth transistor, comprising a first terminal coupled to a second terminal of the third transistor, wherein a second terminal of the fourth transistor is coupled to a reference voltage, a control terminal of the fourth transistor receives the second value signal when a control terminal of the third transistor receives the first value signal, and the control terminal of the fourth transistor receives the first value signal when the control terminal of the third transistor receives the second value signal.

* * * * *